United States Patent
Iijima et al.

(10) Patent No.: US 7,504,040 B2
(45) Date of Patent: Mar. 17, 2009

(54) PLASMA PROCESSING APPARATUS AND PLASMA PROCESSING METHOD

(75) Inventors: Etsuo Iijima, Nirasaki (JP); Hiroshi Tsuchiya, Yongin (JP)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 11/711,769

(22) Filed: Feb. 28, 2007

(65) Prior Publication Data

US 2007/0148364 A1    Jun. 28, 2007

Related U.S. Application Data

(62) Division of application No. 10/469,235, filed as application No. PCT/JP02/02007 on Mar. 5, 2002, now abandoned.

(30) Foreign Application Priority Data

Mar. 6, 2001 (JP) ............... 2001-62284

(51) Int. Cl.
    *B05D 1/04* (2006.01)
(52) U.S. Cl. ............... 216/67; 427/458; 257/E21.252; 257/E21.312
(58) Field of Classification Search .......... None
    See application file for complete search history.

(56) References Cited

U.S. PATENT DOCUMENTS

| | | | |
|---|---|---|---|
| 4,345,968 A | 8/1982 | Coe | |
| 4,479,848 A | 10/1984 | Otsubo et al. | |
| 5,203,945 A | 4/1993 | Hasegawa et al. | |
| 5,529,657 A * | 6/1996 | Ishii | ............ 156/345.26 |
| 5,583,737 A * | 12/1996 | Collins et al. | ............ 361/234 |
| 5,665,166 A | 9/1997 | Deguchi et al. | |
| 5,711,998 A | 1/1998 | Shufflebotham | |
| 5,766,498 A | 6/1998 | Kojima et al. | |
| 5,846,885 A | 12/1998 | Kamata et al. | |
| 5,888,414 A * | 3/1999 | Collins et al. | ............ 216/68 |
| 5,997,962 A | 12/1999 | Ogasawara et al. | |
| 6,089,181 A | 7/2000 | Suemasa et al. | |
| 6,136,165 A | 10/2000 | Moslehi | |
| 6,245,202 B1 | 6/2001 | Edamura et al. | |
| 6,277,716 B1 | 8/2001 | Chhagan et al. | |
| 6,733,624 B2 | 5/2004 | Koshiishi et al. | |
| 6,815,365 B2 | 11/2004 | Masuda et al. | |
| 2002/0026251 A1 | 2/2002 | Johnson et al. | |
| 2003/0119328 A1 | 6/2003 | Fujisato | |
| 2004/0255863 A1 | 12/2004 | Higashiura et al. | |

FOREIGN PATENT DOCUMENTS

| | | |
|---|---|---|
| EP | 1 143 497 A1 | 10/2001 |
| JP | 04-290225 | 10/1992 |
| JP | 2002-9060 | 1/2002 |

* cited by examiner

*Primary Examiner*—Allan Olsen
(74) *Attorney, Agent, or Firm*—Oblon, Spivak, McClelland, Maier & Neustadt, P.C.

(57) ABSTRACT

An RF power (Bottom RF) from a radio-frequency power source 12 is turned off (t5) and the supply of a He gas 14 to a back face of a wafer W is stopped (t5) when an end point detector 17 (EPD) detects an end point (t5), and a high-voltage DC power source 13 (HV) is turned off (t6) under the condition in which an RF power (Top RF) from a radio-frequency power source 11 is controlled to fall within a range in which etching does not progress and plasma discharge can be maintained (t5). This process enables the inhibition of the adhesion of particles while an etching amount is accurately controlled.

7 Claims, 5 Drawing Sheets

PLASMA PROCESSING APPARATUS AND PLASMA PROCESSING METHOD

CROSS REFERENCE TO RELATED APPLICATION

This application is related to and claims priority to U.S. Ser. No. 10/469,235 under 35 U.S.C. § 121, the entire contents of which are incorporated herein by reference. This application is also related to PCT Application PCT/JP02/02007, the entire contents which are incorporated herein by reference.

TECHNICAL FIELD

The present invention relates to a plasma processing apparatus and a plasma processing method, more particularly, to those suitable for use when an RF power is applied to a top and a bottom electrode.

BACKGROUND ART

Some conventional plasma processing apparatus use an electrostatic chuck in order to fix a wafer in a chamber. In a method using this electrostatic chuck, a high DC voltage is applied to the electrostatic chuck to cause a Coulomb force to act on the wafer, thereby fixing the wafer.

In such a plasma processing apparatus, the application of the high DC voltage to the electrostatic chuck under the condition without any plasma causes the surface of the wafer to adsorb particles due to the Coulomb force acting on the wafer. Therefore, at the start of the process, the high DC voltage to the electrostatic chuck is turned on after an RF power is turned on, and at the completion of the process, the RF power is turned off after the high DC voltage to the electrostatic chuck is turned off, thereby preventing the high DC voltage from being applied to the electrostatic chuck under the condition without any plasma to reduce the adhesion of the particles to the surface of the wafer.

In this method, however, due to the exposure of the wafer to the plasma even after the high DC voltage to the electrostatic chuck is turned off, etching progresses up to an etching amount exceeding a desired amount, thereby giving an adverse effect to the finished shape size, and so on, which has posed a problem of deteriorating device performance.

DISCLOSURE OF THE INVENTION

Such being the circumstances, it is an object of the present invention to provide a plasma processing apparatus and a plasma processing method capable of inhibiting the adhesion of particles while an etching amount is accurately controlled.

An aspect of the present invention is characterized in that it includes: a step of fixing a wafer via an electrostatic chuck; a step of applying a first radio-frequency power having a first frequency and a second radio-frequency power having a second frequency lower than the first frequency to thereby plasma-processing the wafer; a step of maintaining plasma discharge within a range in which the plasma processing does not progress after the plasma processing is finished; a step of stopping supply of a coolant gas supplied to a back face of the wafer via the electrostatic chuck; a step of stopping application of a direct-current voltage to the electrostatic chuck; and a step of stopping the plasma discharge after stopping the application of the direct-current voltage.

This structure can prevent the progress of the plasma processing even when the plasma discharge is maintained after the plasma processing is finished. Consequently, even when the application of the direct-current voltage to the electrostatic chuck is stopped with the plasma discharge being maintained, etching does not further progress after the completion of the plasma processing, which makes it possible to stop the application of the direct-current voltage while inhibiting the adhesion of particles to the wafer.

Another aspect of the present invention is characterized in that, in the step of maintaining the plasma discharge, when the plasma processing is finished, the application of the second radio-frequency power is stopped and the first radio-frequency power is controlled so as to maintain the plasma discharge within the range in which the plasma processing does not progress.

With this structure, the plasma discharge can be maintained only by controlling the first radio-frequency power, so that the control can be simplified.

Still another aspect of the present invention is characterized in that, in the step of maintaining the plasma discharge, when the plasma processing is finished, the application of the first radio-frequency power is stopped and the second radio-frequency power is controlled so as to maintain the plasma discharge within the range in which the plasma processing does not progress.

With this structure, it is possible to lower the frequency when the plasma discharge is maintained and to maintain the plasma discharge while the energy of ions incident on the wafer is controlled, thereby reducing charge-up damage.

Yet another aspect of the present invention is characterized in that, in the step of maintaining the plasma discharge, when the plasma processing is finished, the first radio-frequency power and the second radio-frequency power are controlled so as to maintain the plasma discharge within the range in which the plasma processing does not progress, and that, in the step of stopping the plasma discharge, the application of the second radio-frequency power is stopped after the first radio-frequency power is stopped.

With this structure, the plasma discharge can be maintained within the range in which the plasma processing does not progress while plasma density and ion energy are both controlled, which makes it possible to further reduce the adhesion of particles and the occurrence of over-etching and to reduce the charge-up damage.

Yet another aspect of the present invention is characterized in that, in the step of maintaining the plasma discharge, when the plasma processing is finished, the second radio-frequency power is maintained as it is and the first radio-frequency power is controlled so as to maintain the plasma discharge within the range in which the plasma processing does not progress, and that, in the step of stopping the plasma discharge, the application of the second radio-frequency power is stopped after the application of the first radio-frequency power is stopped.

This structure can prevent the plasma discharge from being maintained under the condition in which the ion energy is not controlled, so that the charge-up damage can be reduced.

According to yet another aspect of the present invention, provided is a plasma processing method including: applying a first radio-frequency power having a first frequency and a second radio-frequency power having a second frequency lower than the first frequency to thereby perform plasma processing, the method characterized in that the first radio-frequency power is applied after the second radio-frequency power is applied. With this structure, plasma discharge under the condition in which ion energy is not controlled can be prevented also at the start of the application of the radio-frequency powers, so that the charge-up damage can be reduced. Yet another aspect of the present invention is characterized in that it further includes: a step of stopping the application of the second radio-frequency power after the application of the first radio-frequency power is stopped.

This structure can prevent the plasma discharge under the condition in which the ion energy is not controlled, not only when the application of the radio-frequency power is started but also when the application of the radio-frequency power is stopped, so that the charge-up damage can be further reduced.

Yet another aspect of the present invention is characterized in that the first radio-frequency power is applied to a top electrode and the second radio-frequency power is applied to a bottom electrode.

Yet another aspect of the present invention is characterized in that the first radio-frequency power and the second radio-frequency power are applied to a bottom electrode.

Yet another aspect of the present invention is characterized in that it includes: an electrostatic chuck to fix a wafer on a susceptor; a direct current voltage source to apply a direct current voltage to the electrostatic chuck; a plasma generating unit to generate plasma in a chamber; a plasma discharge control unit to maintain plasma discharge within a range in which the plasma processing does not progress, after the plasma processing is finished; and a direct current voltage stopping unit to stop the application of the direct current voltage to the electrostatic chuck at a certain point in time during which the plasma discharge is maintained.

With this structure, it is possible to maintain the plasma discharge while preventing the progress of the plasma processing, so that the progress of over-etching can be prevented even when the application of the direct current voltage to the electrostatic chuck is stopped with the plasma discharge being maintained in order to prevent the adhesion of particles to the wafer. Yet another aspect of the present invention is characterized in that the plasma generating unit includes: a top electrode; a bottom electrode; a top power applying unit to apply a radio-frequency power to the top electrode; and a bottom power applying unit to apply a radio-frequency power to the bottom electrode, and that the plasma discharge control unit maintains the plasma discharge within the range in which the plasma processing does not progress, and controls the application of the radio-frequency power to the bottom electrode to be stopped after controlling the application of the radio-frequency power to the top electrode to be stopped.

Yet another aspect of the present invention is characterized in that the plasma generating unit includes: a top electrode; a bottom electrode; a first power applying unit to apply a first radio-frequency power having a first frequency to the top electrode; and a second power applying unit to apply a second radio-frequency power having a second frequency lower than the first frequency to the top electrode, and that the plasma discharge control unit maintains the plasma discharge within the range in which the plasma processing does not progress, and controls the application of the second radio-frequency power to be stopped after controlling the application of the first radio-frequency power to be stopped.

This structure makes it possible to maintain the plasma discharge within the range in which the plasma processing does not progress while ion energy is controlled, so that the adhesion of particles to the wafer can be inhibited without being accompanied by the charge-up damage.

Yet another aspect of the present invention is characterized in that it further includes a coolant gas supply unit to supply a coolant gas to a back face of the wafer via the electrostatic chuck; and a coolant gas stopping unit to stop the supply of the coolant gas before the application of the direct current voltage to the electrostatic chuck is stopped, after the plasma processing is finished.

This structure makes it possible to lower the pressure given to the back face of the wafer before the chucking of the wafer is stopped, so that failure in chucking the wafer can be prevented.

BEST MODE FOR CARRYING OUT THE INVENTION

Hereinafter, a plasma processing apparatus according to embodiments of the present invention will be explained with reference to the drawings.

Figure 1:
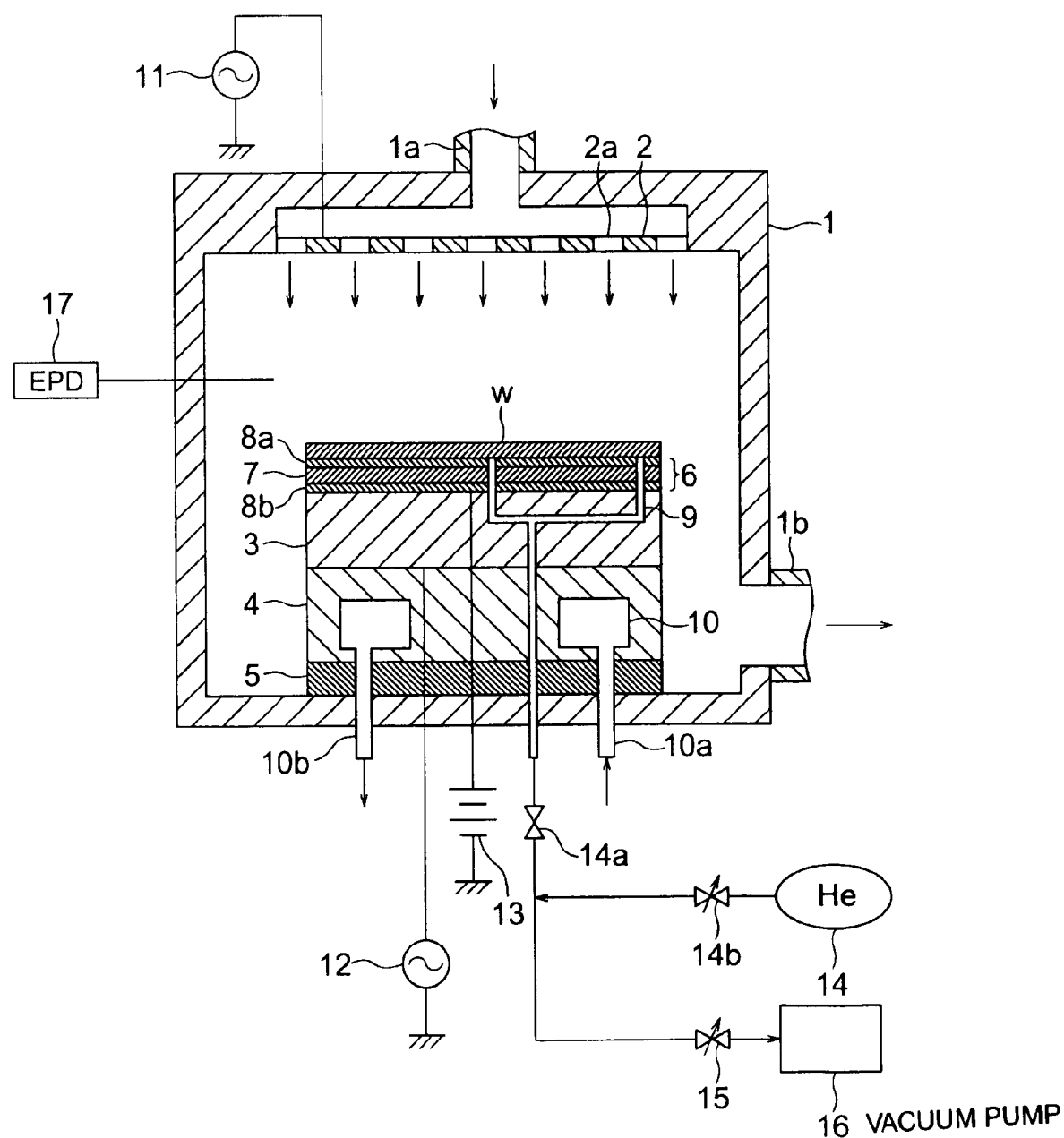
FIG. 1 is a cross sectional view showing the schematic configuration of a plasma processing apparatus according to an embodiment of the present invention.

FIG. 1 is a cross sectional view showing the schematic configuration of a plasma processing apparatus according to an embodiment of the present invention. In FIG. 1, a top electrode 2 and a susceptor 3 are provided in a process chamber 1, and this susceptor 3 also serves as a bottom electrode. Gas blowout ports 2a through which an etching gas is introduced into the process chamber 1 are provided in the top electrode 2. The susceptor 3 is supported on a susceptor supporting table 4 and the susceptor supporting table 4 is held in the process chamber 1 via an insulating plate 5. Further, radio-frequency power sources 11, 12 are connected to the top electrode 2 and the susceptor 3 respectively to plasmatize the etching gas introduced into the process chamber 1. A main function of the top electrode 2 is to ionize gas molecules introduced into the process chamber 1, by a radio-frequency power applied thereto from the radio-frequency power source 11, thereby generating plasma. A main function of the bottom electrode serving also as the susceptor 3 is to control the energy of ions incident on a water W without changing plasma density or a radical composition ratio, by a radio-frequency power that is applied from the radio-frequency power source 12 and that has a frequency of 13.56 MHz or lower, which is equal to or lower than that of the radio-frequency power applied by the radio-frequency power source 11. Incidentally, as the frequencies of the radio-frequency power sources 11, 12, the combination such as 100 MHz and 13.56 MHz, 100 MHz and 3.2 MHz, 60 MHz and 13.56 MHz, 60 MHz and 2 MHz, 27.12 MHz and 800 KHz, and 13.56 MHz and 13.56 MHz can be used. Note that the combination of 60 MHz and 13.56 MHz is used in this example.

A refrigerant chamber 10 is provided in the susceptor supporting table 4 and a refrigerant such as liquid nitrogen circulates in the refrigerant chamber 10 via a refrigerant supply pipe 10a and a refrigerant discharge pipe 10b. Cold heat generated from here is transferred to the wafer W via the susceptor supporting table 4 and the susceptor 3, so that the wafer W can be cooled.

An electrostatic chuck 6 is provided on the susceptor 3. The electrostatic chuck 6 has such a structure that, for example, a conductive layer 7 is sandwiched by polyimide films 8a, 8b. A high-voltage DC power source 13 is connected to the conductive layer 7, and the application of a DC high voltage to the conductive layer 7 causes a Coulomb force to act on the wafer W, so that the wafer W can be fixed onto the susceptor 3.

Further, a gas passage 9 through which a He gas is introduced is formed in the susceptor 3 and the electrostatic chuck 6. The gas passage 9 is connected to a He gas supply source 14 via an opening/closing valve 14a and a flow rate adjusting valve 14b, and is connected to a vacuum pump 16 via a flow rate adjusting valve 15.

When the He gas of, for example, several hundreds Pa is supplied to a back face of the wafer W through this gas passage 9, the wafer W placed on the susceptor 3 can be cooled. Further, when the chucking of the wafer W is released, the back face of the wafer W is vacuumed to eliminate a difference in pressure between the back face of the wafer W and the inside of the process chamber 1, which can prevent the wafer W from being blown off.

The process chamber 1 has a gas supply pipe 1a and an exhaust pipe 1b, and the gas supply pipe 1a is connected to a gas supply source. The exhaust pipe 1b is connected to a vacuum pump, and when the inside of the process chamber 1 is exhausted by this vacuum pump, the pressure in the process chamber 1 can be adjusted to, for example several Pa.

An end point detector 17 is connected to the process chamber 1. An emission spectrum radiated from the wafer W is monitored through the use of this end point detector 17, so that the end point of etching can be detected. Incidentally, etching depth may be obtained from the phase of the intensity of a reflected interference light after the wafer W is irradiated with light having one waveform or two different waveforms or more.

Figure 2A:
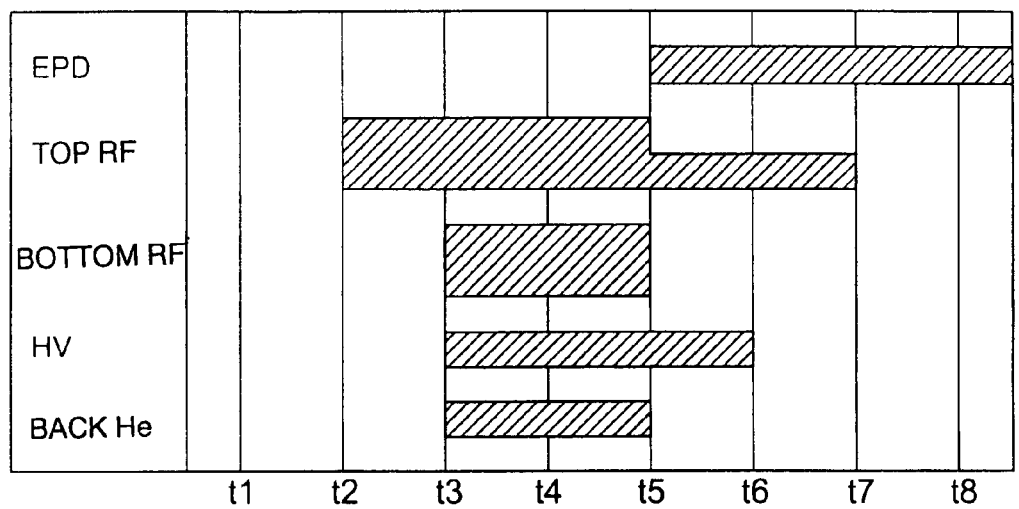
FIG. 2A and FIG. 2B are views showing the comparison between the plasma processing sequence according to a first embodiment of the present invention and that according to a conventional example.
Figure 2B:
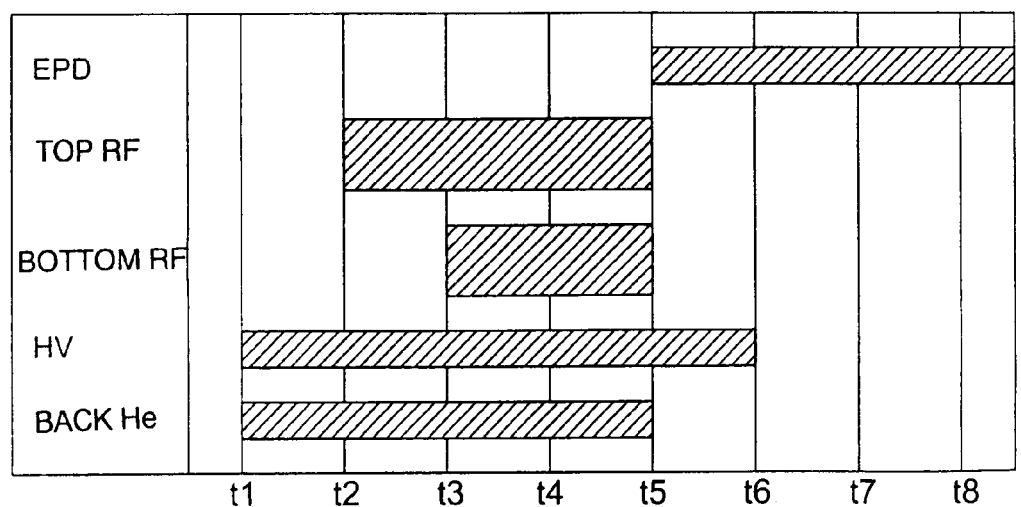

FIG. 2A and FIG. 2B are views showing the comparison between the plasma processing sequence according to a first embodiment of the present invention and that of a conventional example. Note that 'EPD' denotes the end point detection by the end point detector 17, 'Top RF' denotes the RF power application to the top electrode 2, 'Bottom RF' denotes the RF power application to the susceptor 3, 'HV' denotes ON/OFF of the electrostatic chuck 6, and 'Back He' denotes the introduction of the He gas to the back face of the wafer W, respectively.

In FIG. 2A, the wafer W is placed on the susceptor 3 when it is to be plasma-processed. Then, the inside of the process chamber 1 is exhausted, and the etching gas is introduced into the process chamber 1 while the pressure inside the process chamber 1 is adjusted.

Next, after the RF power from the radio-frequency power source 11 is applied to the top electrode 2 (t2), the RF power from the radio-frequency power source 12 is applied to the susceptor 3 (t3), to thereby plasmatize the etching gas and control the energy of ions incident on the wafer W. At the same time, the high-voltage DC power source 13 (HV) is turned on to fix the wafer W by the electrostatic chuck 6, and the opening/closing valve 14a is opened to have the He gas 14 (Back He) emitted to the back face of the wafer W, thereby controlling the temperature of the wafer W.

Thus, after the RF power is applied to the top electrode 2, the RF power is applied to the susceptor 3 and the high-voltage DC power source 13 is turned on, so that the application of the high DC voltage to the electrostatic chuck 6 under the condition without any plasma can be prevented, which makes it possible to inhibit the adhesion of particles to the surface of the wafer W.

Next, when the end point detector 17 (EPD) detects the end point (t5), the RF power (Bottom RF) from the radio-frequency power source 12 is turned off (t5) and the supply of the He gas 14 to the back face of the wafer W is stopped (t5). Further, the RF power (Top RF) from the radio-frequency power source 11 is controlled to a value within a range in which etching does not progress and the plasma discharge can be maintained, for example, 200 W or lower (t5).

Incidentally, as for the end point detecting method, a method of detecting the end point based on the measurement result of the etching time may be adopted, besides the method using the end point detector 17.

With this sequence, the supply of the He gas 14 to the back face of the wafer W is stopped before the wafer W can be detached from the electrostatic chuck 6, so that it is made possible to prevent the wafer W from being blown off due to the pressure of the He gas 14.

Next, the high-voltage DC power source 13 is turned off to allow the wafer W to be detached from the electrostatic chuck 6 (t6). Then, the RF power from the radio-frequency power source 11 is turned off to stop the plasma discharge (t7).

With this sequence, since the plasma discharge is maintained when the high-voltage DC power source 13 is turned off, the adhesion of the particles to the wafer can be inhibited. Further, the plasma discharge at this time is controlled to be within a power not promoting the etching, so that the etching progress can be inhibited even when the plasma discharge is maintained after the detection of the end point by the end point detector 17.

Incidentally, the back face of the wafer W may be vacuumed by opening the opening/closing valve 15 when the supply of the He gas 14 to the back face of the wafer W is stopped. This makes it possible to make the pressure of the back face of the wafer W equal to the pressure inside the process chamber 1, which enables more complete prevention of the failure in chucking the wafer.

Meanwhile, as shown in FIG. 2B, when the RF power is turned on after the high-voltage DC power source 13 is turned on, the Coulomb force acts on the wafer W under the condition without any plasma, so that the adhesion of the particles to the wafer W at the start of the etching is increased. Further, when the RF power from the radio-frequency power source 12 is turned off and at the same time, the RF power from the radio-frequency power source 11 is turned off at the detection of the end point by the end point detector 17 (EPD) (t5), the Coulomb force acts on the wafer W under the condition without any plasma. This increases the adhesion of the particles to the wafer W also at the etching completion.

For example, as an experiment example, using a photoresist film having opening portions patterned therein as a mask on a sample formed by laminating a silicon oxide film, a polycrystalline silicon film, and an anti-reflection coating, etching was conducted for the polycrystalline silicon film and the anti-reflection coating, and thereafter, the number of defects on the wafer W was counted by a pattern defect inspector.

Figure 3:
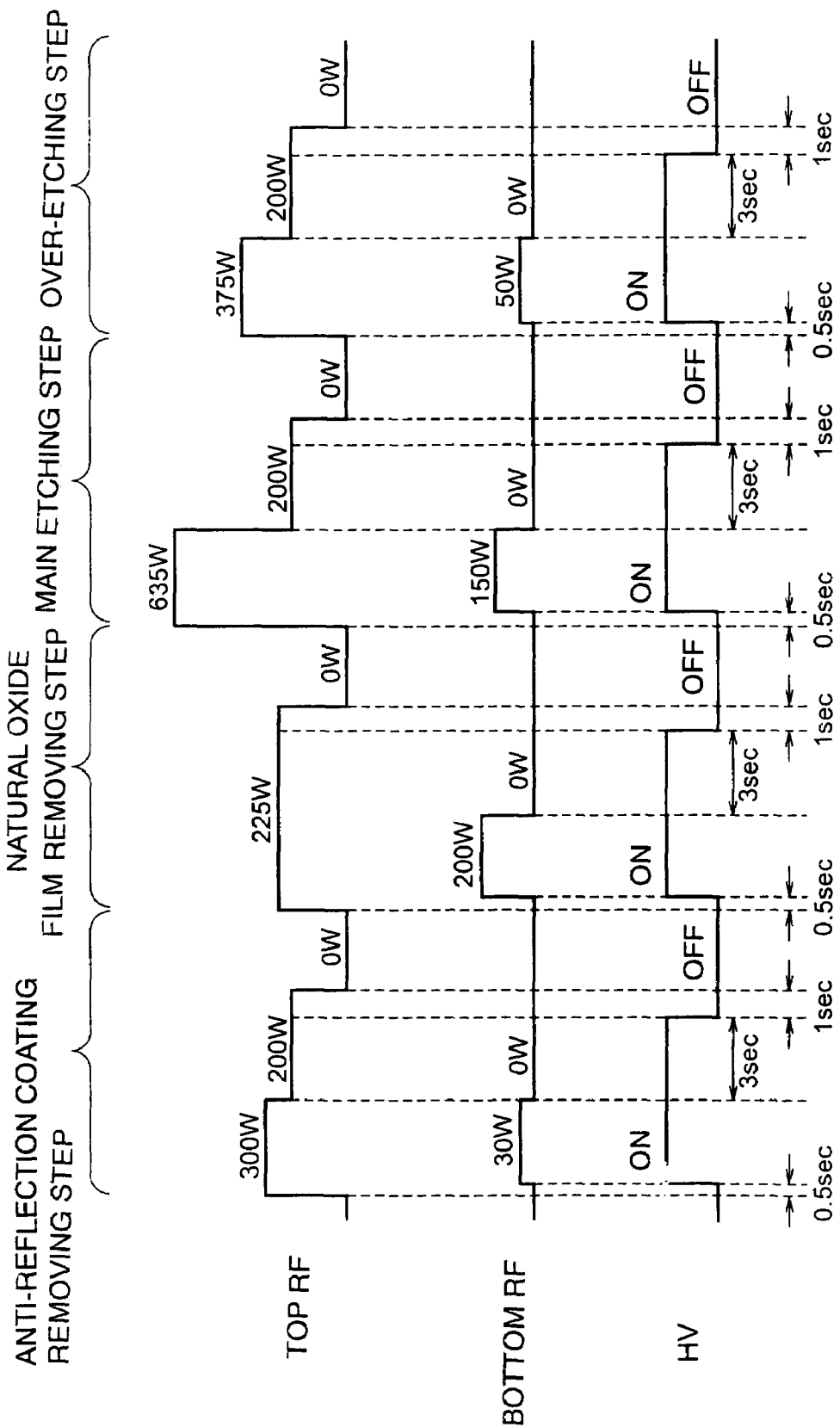
FIG. 3 is a view showing an experiment example of the plasma processing sequence according to an embodiment of the present invention.

FIG. 3 is a view showing the plasma processing sequence in this experiment example following the sequence in FIG. 2A. In FIG. 3, the etching conditions of the anti-reflection coating were so set that a $Cl_2$ mixed gas was used and the He pressure on the back face of the wafer W was 399 Pa. Further, the RF power to the top electrode 2 was set to 300 W; after 0.5 seconds, the high-voltage DC power source 13 was turned on and the RF power to the susceptor 3 was set to 30 W to perform etching; after the etching, the RF power to the susceptor 3 was turned off and the RF power to the top electrode 2 was lowered to 200 W; after 3 seconds, the high-voltage DC power source 13 was turned off; and after 1 second, the RF power to the top electrode 2 was turned off.

Meanwhile, a $Cl_2$ gas was used as the etching condition of a natural oxide film on the surface of the polycrystalline silicon film. Further, the RF power to the top electrode 2 was set to 225 W; after 0.5 second, the high-voltage DC power source 13 was turned on and the RF power to the susceptor 3 was set to 200 W to perform etching; after the etching, the RF power to the susceptor 3 was turned off; after 3 seconds, the high-voltage DC power source 13 was turned off; and after 1 second, the RF power to the top electrode 2 was turned off.

A $Cl_2$ mixed gas was used as the main etching condition of the polycrystalline silicon film. Further, the RF power to the top electrode 2 was set to 635 W; after 0.5 second, the high-voltage DC power source 13 was turned on and the RF power to the susceptor 3 was set to 150 W to perform etching; after the etching, the RF power to the susceptor 3 was turned off and the RF power to the top electrode 2 was lowered to 200 W; after 3 seconds, the high-voltage DC power source 13 was turned off; and after 1 second, the RF power to the top electrode 2 was turned off.

As the over-etching condition of the polycrystalline silicon film, an HBr mixed gas was used. Further, the RF power to the top electrode 2 was set to 375 W; after 0.5 second, the high-voltage DC power source 13 was turned on and the RF power to the susceptor 3 was set to 50 W to perform etching; after the etching, the RF power to the susceptor 3 was turned off and the RF power to the top electrode 2 was lowered to 200 W; after 3 seconds, the high-voltage DC power source 13 was turned off; and after 1 second, the RF power to the top electrode 2 was turned off.

As a result of processing 25 wafers W following the plasma processing sequences according to FIG. 2A and FIG. 2B respectively, the number of defects in the secondly processed wafer in the sequence in FIG. 2A was lower, namely, 5.3% of that in the sequence in FIG. 2B. Moreover, the number of defects in the thirteenth processed wafer in the sequence in FIG. 2A was lower, namely, 8.6% of that in the sequence in FIG. 2B. Further, the number of defects in the twenty-fourth processed wafer in the sequence in FIG. 2A was lower, namely, 4.5% of that in the sequence in FIG. 2B.

Incidentally, the RIE apparatus that applies the RF power to the top and bottom electrodes was taken as an example in the explanation on the embodiment above, but the present invention is also applicable to an etching apparatus that applies a first radio-frequency power having a relatively high frequency and a second radio-frequency power having a frequency lower than the first radio-frequency power to a bottom electrode on which a wafer W is placed. The present invention may be also applied to apparatuses other than the etching apparatus, and for example, it may be applied to a plasma CVD apparatus and so on. This makes it possible to inhibit the adhesion of particles while the film thickness is accurately controlled.

The present invention may also be applied to a magnetron plasma processor, an ECR (electronic cyclotron resonance) plasma processor, a HEP (helicon wave excited plasma) processor, an ICP (inductively coupled plasma) processor, a TCP (transfer coupled plasma) processor, and so on.

Figure 4A:
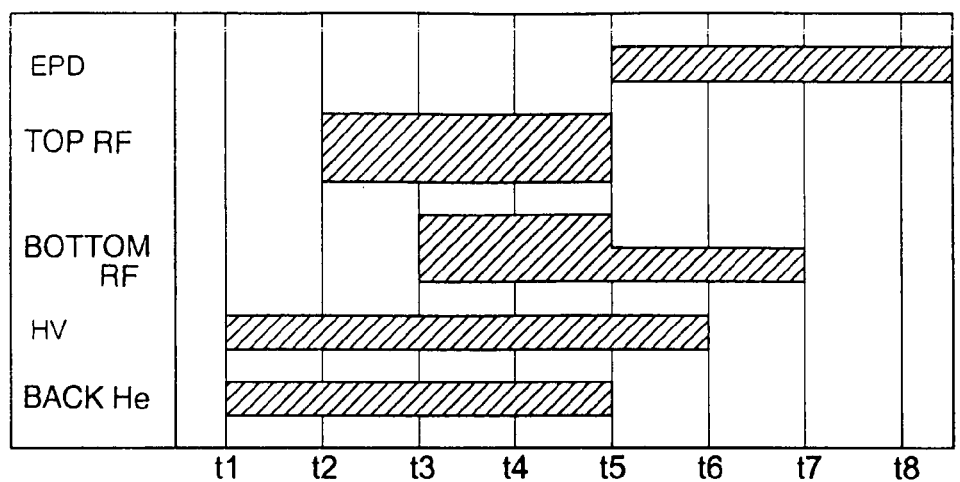
FIG. 4A, FIG. 4B, and FIG. 4C are views showing the plasma processing sequence according to second to fourth embodiments of the present invention.
Figure 4B:
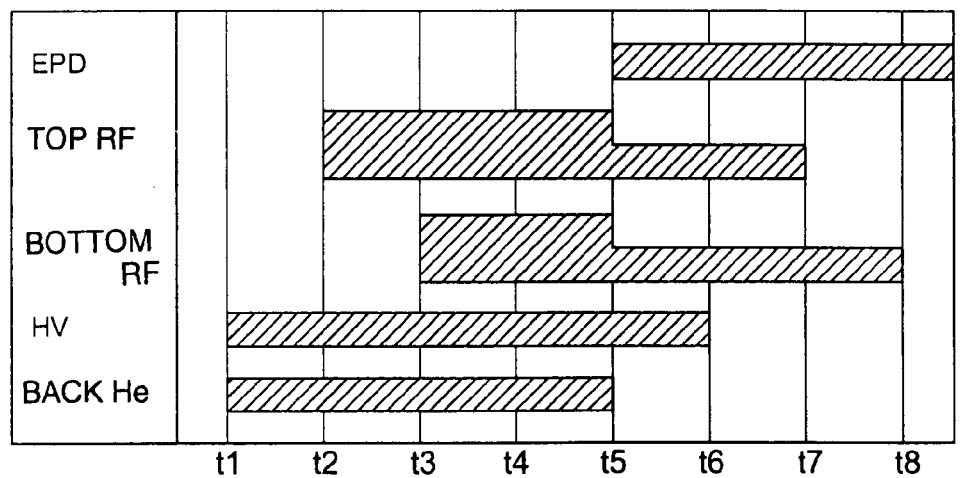
Figure 4C:
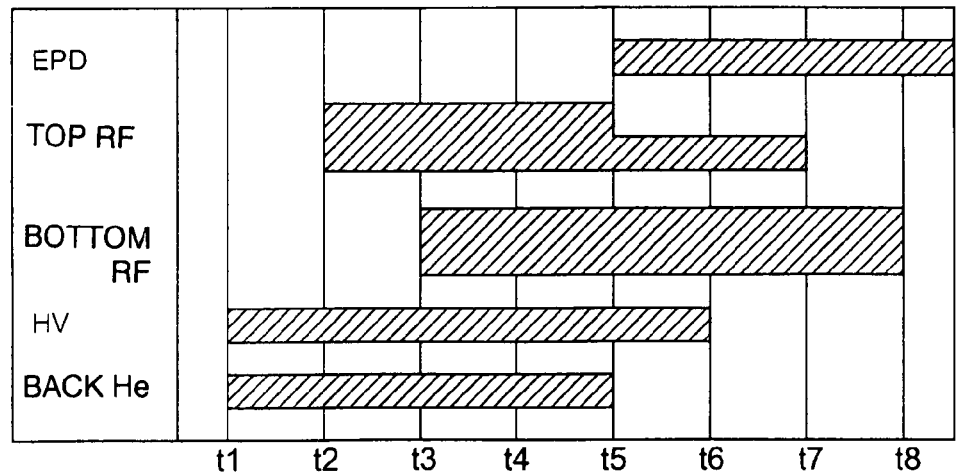

FIG. 4A, FIG. 4B, and FIG. 4C are views showing plasma processing sequences according to second to fourth embodiments of the present invention. In the aforesaid embodiment shown in FIG. 2A, the RF power from the radio-frequency power source 12 is turned off at the detection of the end point by the end point detector 17 (t5), and at the same time, the RF power from the radio-frequency power source 11 is controlled to fall within a range in which the etching does not progress and the plasma discharge can be maintained. On the other hand, in the embodiment shown in FIG. 4A, the RF power from the radio-frequency power source 11 is turned off at the detection of the end point by the end point detector 17 (t5), and at the same time, the RF power from the radio-frequency power source 12 is controlled to fall within a range in which the etching does not progress and the plasma discharge can be maintained.

This makes it possible to maintain the plasma discharge so as to prevent the progress of the etching while the energy of ions incident on the wafer W is controlled, so that the adhesion of the particles can be inhibited and the charge-up damage can be reduced.

In the embodiment shown in FIG. 4B, neither of the RF powers from the radio-frequency power sources 11, 12 is turned off at the detection of the end point by the end point detector 17 (t5), but the RF powers from the radio-frequency power sources 11, 12 are controlled to fall within the range in which the etching does not progress and the plasma discharge can be maintained. Then, the high-voltage DC power source 13 is turned off to allow the wafer W to be detached from the electrostatic chuck 6 (t6). Thereafter, after the RF power from the radio-frequency power source 11 is turned off (t7), the RF power from the radio-frequency power source 12 is turned off (t8).

This makes it possible to maintain the plasma discharge within a range in which the plasma processing does not progress, while plasma density and ion energy are both controlled, so that the adhesion of the particles and the occurrence of over-etching can be further inhibited and the charge-up damage can be reduced.

In the embodiment shown in FIG. 4(*c*), the RF power from the radio-frequency power source 12 is not lowered but is maintained as it is at the detection of the end point by the end point detector 17 (t5), and at the same time, the RF power from the radio-frequency power source 11 is controlled to fall within the range in which the etching does not progress and the plasma discharge can be maintained. Then, the high-voltage DC power source 13 is turned off to allow the wafer W to be detached from the electrostatic chuck 6 (t6). Thereafter, after the RF power from the radio-frequency power source 11 is turned off (t7), the RF power from the radio-frequency power source 12 is turned off (t8).

This also makes it possible to prevent the plasma discharge from being maintained under the condition in which the ion energy is not controlled, so that the charge-up damage can be reduced.

Figure 5A:
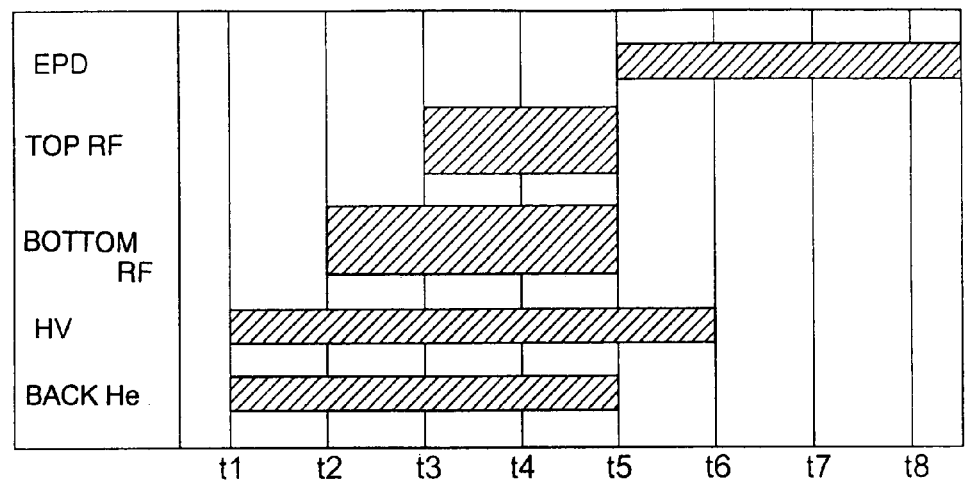
FIG. 5A and FIG. 5B are views showing the comparison between the plasma processing sequence according to a fifth embodiment of the present invention and that according to the conventional example.
Figure 5B:
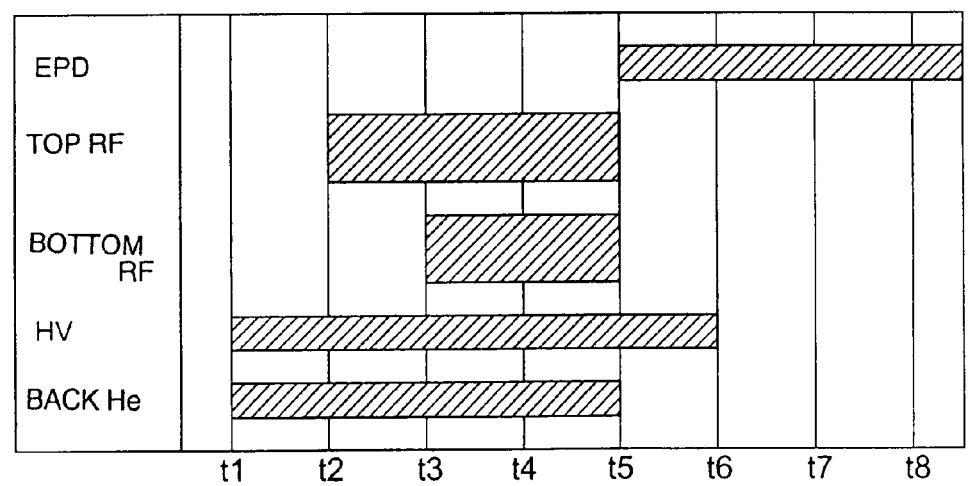

FIG. 5A and FIG. 5B are views showing the comparison between the plasma processing sequence according to a fifth embodiment of the present invention and that according to the conventional example. Note that this fifth embodiment relates to a method of starting the application of the RF power, though the above-described first embodiment relates to a method of starting and finishing the application of the RF power and the second to fourth embodiments relate to a method of finishing the application of the RF power.

In FIG. 5B, according to the conventional method, after the wafer W is placed on the susceptor 3, the high-voltage DC power source 13 is turned on to fix the wafer W by the electrostatic chuck 6 (t1) and at the same time, the He gas 14 is supplied to the back face of the wafer W (t1). Then, after the RF power from the radio-frequency power source 11 is turned on (t2), the RF power from the radio-frequency power source 12 is turned on (t3).

On the other hand, in this embodiment, the wafer W is fixed by the electrostatic chuck 6 (t1) and at the same time, the He gas 14 is supplied to the back face of the wafer W (t1), as shown in FIG. 5A. Then, after the RF power from the radio-frequency power source 12 is turned on (t2), the RF power from the radio-frequency power source 11 is turned on (t3).

This makes it possible to prevent the plasma discharge from being started under the condition in which ion energy is not controlled, when the application of the RF power is started, so that the charge-up damage can be reduced.

For example, as an experiment example, the polycrystalline silicon film on the silicon oxide film was etched under the conditions that a $Cl_2$ gas was used at the flow rate of 50 sccm, the RF power to the top electrode 2 was set to 525 W, the RF power to the susceptor 3 was set to 70 W, the pressure was set to 0.665 Pa, and the distance between the electrodes was set to 115 mm. In this case, in comparison with 8% defective ratio of a silicon oxide film withstand voltage in the sequence shown in FIG. 5B, 0% defective ratio of a silicon oxide film withstand voltage was achieved in the sequence shown in FIG. 5A.

Incidentally, in the embodiment in FIG. 5A, the explanation is given on the method in which the RF power from the radio-frequency power source 12 is turned on after the high-voltage DC power source 13 is turned on, and thereafter, the RF power from the radio-frequency power source 11 is turned on, but the high-voltage DC power source 13 may be turned on after the RF power from the radio-frequency power source 12 is turned on and the RF power from the radio-frequency power source 11 is further turned on. This makes it possible not only to reduce the charge-up damage but also to inhibit the adhesion of the particles also at the stage of starting the application of the RF power.

Further, when the RF powers from the radio-frequency power sources 11, 12 are turned on before the high-voltage DC power source 13 is turned on, the RF powers from the radio-frequency power sources 11, 12 may be controlled to fall within a range in which the etching does not progress and the plasma discharge can be maintained during this time. This makes it possible to inhibit the adhesion of particles and to prevent the progress of the etching before predetermined conditions are not satisfied.

In the embodiment in FIG. 5A, the explanation is given on the method in which the RF powers from the radio-frequency power sources 11, 12 are turned off simultaneously, when the RF powers from the radio-frequency power sources 11, 12 are to be turned off, but the RF power from the radio-frequency power source 12 may be turned off after the RF power from the radio-frequency power source 11 is turned off.

As is explained hitherto, according to the present invention, the adhesion of particles can be inhibited while an etching amount is controlled accurately.

INDUSTRIAL APPLICABILITY

A plasma processing apparatus and a plasma processing method according to the present invention are usable in the semiconductor manufacturing industry in which semiconductor devices are manufactured, and so on. Therefore, both have industrial applicability.

What is claimed is:

1. A plasma processing method, comprising:
a step of fixing a wafer via an electrostatic chuck;
a step of applying a first radio-frequency power for generating a plasma having a first frequency and a second radio-frequency power for controlling ion energy having a second frequency lower than the first frequency to thereby plasma-process the wafer;
a step of maintaining plasma discharge within a range in which the plasma processing does not progress by turning off the second radio-frequency power and lowering the first radio-frequency power or turning off the first radio-frequency power and lowering the second radio-frequency power after the plasma processing is finished;
a step of stopping supply of a coolant gas supplied to a back face of the wafer via the electrostatic chuck;
a step of stopping application of a direct-current voltage to the electrostatic chuck; and
a step of stopping the plasma discharge after stopping the application of the direct-current voltage.

2. The method as set forth in claim 1,
wherein, in the step of maintaining the plasma discharge, when the plasma processing is finished, the application of the second radio-frequency power is stopped and the first radio-frequency power is controlled to maintain the plasma discharge within a range in which the plasma processing does not progress.

3. The method as set forth in claim 1,
wherein, in the step of maintaining the plasma discharge, when the plasma processing is finished, the application of the first radio-frequency power is stopped and the second radio-frequency power is controlled to maintain the plasma discharge within a range in which the plasma processing does not progress.

4. The method as set forth in claim 1,
wherein, in the step of maintaining the plasma discharge, when the plasma processing is finished, the first radio-frequency power and the second radio-frequency power are controlled to maintain the plasma discharge within a range in which the plasma processing does not progress, and
wherein, in the step of stopping the plasma discharge, the application of the second radio-frequency power is stopped after the application of the first radio-frequency power is stopped.

5. The method as set forth in claim 1,
wherein, in the step of maintaining the plasma discharge, when the plasma processing is finished, the second radio-frequency power is maintained as it is and the first radio-frequency power is controlled to maintain the plasma discharge within a range in which the plasma processing does not progress, and
wherein, in the step of stopping the plasma discharge, the application of the second radio-frequency power is stopped after the application of the first radio-frequency power is stopped.

6. The method as set forth in claim 1,
wherein, the first radio-frequency power is applied to a top electrode and the second radio-frequency power is applied to a bottom electrode.

7. The method as set forth in claim 1,
wherein the first radio-frequency power and the second radio-frequency power are applied to a bottom electrode.

* * * * *